United States Patent [19]

Andoh

[11] Patent Number: 5,107,220
[45] Date of Patent: Apr. 21, 1992

[54] FREQUENCY SYNTHESIZER
[75] Inventor: Akira Andoh, Hyogo, Japan
[73] Assignee: Mitsubishi Denki Kabushiki Kaisha, Tokyo, Japan
[21] Appl. No.: 682,255
[22] Filed: Apr. 9, 1991
[30] Foreign Application Priority Data
  Jun. 15, 1990 [JP]  Japan .................................. 2-156911
[51] Int. Cl.$^5$ ............................ H03K 5/13; H03K 3/26
[52] U.S. Cl. .......................................... 328/14; 328/16; 328/155; 307/262; 307/271
[58] Field of Search ........................... 328/14, 16, 155; 307/262, 271

[56] References Cited
U.S. PATENT DOCUMENTS
  4,893,087 1/1990 Davis .................................. 307/271

Primary Examiner—Stanley D. Miller
Assistant Examiner—Margaret Rose Wambach
Attorney, Agent, or Firm—Rothwell, Figg, Ernst & Kurz

[57] ABSTRACT

A frequency synthesizer includes a control circuit which outputs changeover signals for bringing one of a number of filters included in a loop filter into electrical connection with a VCO outputting a desired frequency signal, such that a phase difference signal passes through one filter when a demand for frequency changeover is made, and provides a frequency division ratio corresponding to said one filter to a variable frequency divider and a reference frequency divider whose phases are compared to produce the phase difference signal. In addition, the control circuit successively supplies changeover signals for performing selection of respective filters through each of which the phase difference signal passes, and provides frequency division ratios corresponding to filters tuned to the variable frequency divider and the reference frequency divider to change the output frequency of the VCO incrementally. Furthermore, the control circuit provides changeover signals for connection filters employed in a steady state. The time required between each step in the frequency changeover process can be shortened by setting a time constant for each of the filters to a value such that an intermediate output signal representative of a frequency determined by the frequency division ratio corresponding to each filter is stabilized in a short period of time.

10 Claims, 9 Drawing Sheets

FREQUENCY SYNTHESIZER

BACKGROUND OF THE INVENTION

1. Field of the Invention

The present invention relates to a frequency synthesizer employing a phase synchronous loop, which is utilized in telecommunications systems such as TDMA (time-division multiple access) systems for satellite communications networks.

2. Description of the Prior Art

Figure 1:
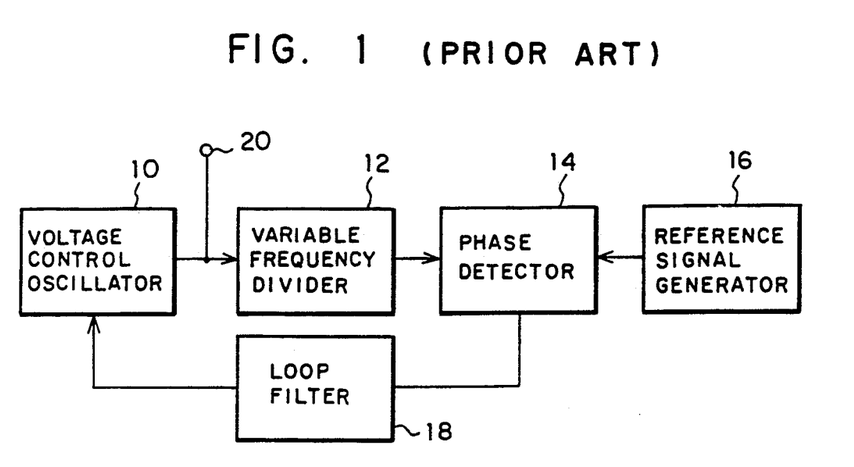
FIG. 1 is a block diagram showing a conventional frequency synthesizer.

FIG. 1 is a block diagram showing one example of a known frequency synthesizer as disclosed in Japanese Laid-Open Patent Publication No. 61-134127. 10 is a voltage controlled oscillator (hereinafter called "VCO") for supplying an output signal having a frequency corresponding to a control voltage, at an output terminal 20. Numeral 12 is a variable frequency divider of a frequency division ratio variable type for providing frequency division of the output signal from VCO 10. Numeral 14 is a phase detector (PD) for comparing the phase of an output signal from the variable frequency divider 12 with the phase of a reference signal outputted from a reference signal generator 16. Numeral 18 indicates a loop filter for supplying, as a control voltage, a phase difference signal outputted from the phase detector 14 to the VCO 10 and for fixing the characteristic of the loop defined by the VCO 10, frequency divider 12, phase detector 14, and filter 18.

Figure 2:
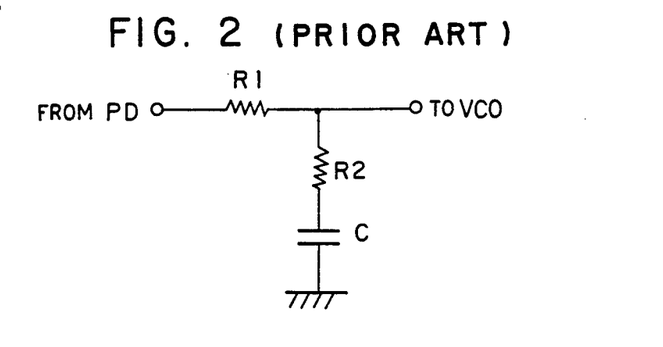
FIGS. 2 and 3 are circuit diagrams depicting conventional loop filters.

FIG. 2 is a circuit diagram showing one example of a structure of the loop filter 18. In the drawing, $R_1$, $R_2$ are resistors and C is a capacitor. Incidentally, $R_1$ and $R_2$ also represent the resistance values of the resistors and C indicates the capacitance value of the capacitor.

A description will now be made of the operation of the frequency synthesizer. The phase detector 14 serves to compare the phase of the output signal from the variable frequency divider 12 with the phase of the reference signal outputted from the reference signal generator 16 for producing therefrom a phase difference signal in the form of a mean voltage proportional to the resultant phase difference. The phase difference signal is used as the control voltage for the VCO 10 after having passed through the loop filter 18. This VCO 10 serves to generate an output signal having a frequency corresponding to the control voltage. Then, the output signal from VCO 10 is supplied to output terminal 20 and is frequency divided by the variable frequency divider 12. Given that the frequency division ratio set in the variable frequency divider 12 is N, the frequency of the output signal is equal to N times the frequency of the reference signal during a phase-locked period (steady state).

A filter often used as the loop filter 18 is the lag-lead type filter shown in FIG. 2. When the lag-lead type filter is adopted, the natural angular frequency $\omega_n$ of the loop and the damping coefficient $\zeta$ of the loop are expressed as follows:

$$\omega_n = \left(\frac{K}{\tau_1 + \tau_2}\right)^{\frac{1}{2}} \quad (1)$$

$$\zeta = \frac{\omega_n}{2}\left(\frac{1}{K} + \tau_2\right) \quad (2)$$

where
$\tau_1 = R_1 C$
$\tau_2 = R_2 C$
K = loop gain of the loop or $$K = \frac{K_v \cdot K_\phi}{N} \quad (3)$$

where
$K_v$ = sensitivity (conversion gain) of the VCO 10
$K_\phi$ = sensitivity (conversion gain) of the phase detector 14
N = frequency division ratio of the variable frequency divider 12

The frequency synthesizer produces different output frequencies whenever the frequency-division ratios N of the variable frequency divider 12 are changed over from one to another. However, the natural angular frequency and the damping coefficient are set such that the time interval or frequency changeover time that is required to make each of the output frequencies stable after a frequency changeover has been made by changing the frequency division ratio N of divider 12, becomes a value not exceeding a predetermined value over the entire range of possible output frequencies. In addition, the resistance values of $R_1$, $R_2$ and the capacitance value of C are determined by considering the operation of the loop filter 18 for eliminating noise or the like from the phase difference signal of detector 14 under steady state.

Figure 3:
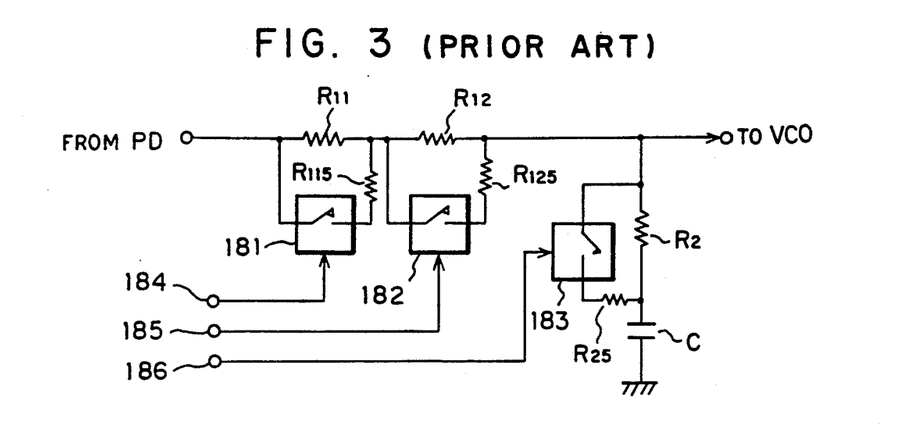

FIG. 3 is a circuit diagram showing an example of the loop filter 18 disclosed in the above-mentioned Japanese Laid-Open Patent Publication. In FIG. 3, 181-183 are switches for performing changeover between resistors $R_{11}$, $R_{12}$, $R_2$ and resistors $R_{11S} = R_{11} \| R_{115}$, $R_{12S} = R_{12} \| R_{125}$ and $R_{2S} = R_2 \| R_{25}$. Numerals 184-186 are control terminals for receiving control signals used for the changeover of the switches 181-183. The resistance values of the respective resistors referred to above are established by the following inequalities, i.e., $R_{11S} < R_{11}$, $R_{12S} < R_{12}$, and $R_{2S} < R_2$. Each of the switches 181-183 is left open in the steady state, and the loop filter 18 is comprised of the resistors $R_{11}$, $R_{12}$, $R_2$ and the capacitor C. The switches 181-183 are closed by associated control signals when a frequency changeover is made, i.e. when the value of N is changed in the frequency divider 12. Since the resistance values of the resistors $R_{11S}$, $R_{12S}$, $R_{2S}$ are smaller than those of the resistors $R_{11}$, $R_{12}$, $R_2$, and the loop filter 18 consists of the resistors $R_{11S}$, $R_{12S}$, $R_{2S}$ and the capacitor C when the switches are closed, two time constants, $\tau_1 = (R_{11S} + R_{12S})C$ and $\tau_2 = R_{2S}C$ of the loop filter 18 become small. As a result, the natural angular frequency $\omega_n$ becomes larger as is apparent from the expression (1). Accordingly, the loop bandwidth becomes wider and the frequency changeover time is made shorter.

Since the conventional frequency synthesizer is constructed as described above, the loop gain K remains unchanged and thus a great improvement in the frequency changeover time cannot be made by merely performing changes in the RC time constants used in the loop filter 18, and further difficulties are encountered upon setting of the damping coefficients to appropriate values with a mere change in the time constants, thereby causing a problem that the loop is liable to be unstable.

SUMMARY OF THE INVENTION

With the foregoing problem in view, it is an object of the present invention to provide a stable frequency synthesizer which can make the frequency changeover time shorter, and has adequate damping coefficients even during the frequency changeover process.

A frequency synthesizer according to the present invention includes a loop filter comprised of a plurality of filter circuits whose time constants are set to values such that respective output frequencies determined by individual frequency division ratios set in a variable frequency divider and a reference frequency divider are brought into a steady state in a short period of time after the frequency changeover process. The frequency synthesizer also includes changeover switches provided within the loop filter for connecting and disconnecting the input side of each filter circuit to and from a charge pump and connecting and disconnecting the output side of each filter circuit to and from a VCO, and a control circuit for setting frequency division ratios corresponding to incremental steps in the frequency changeover process and for outputting a changeover signal to the changeover switches for connecting each of the filter circuits corresponding to the set frequency division ratios to the charge pump and the VCO.

In addition to the above-described structure, the frequency synthesizer according to the present invention also includes a charge/discharge circuit for charging or discharging each of the capacitor components of the filter circuits such that the voltage of each capacitor which is disconnected from the charge pump and the VCO becomes equal to the output voltage of the filter circuit which is connected to the charge pump and the VCO.

The above and other objects, features and advantages of the present invention will become more apparent from the following detailed description taken in conjunction with the accompanying drawings, in which preferred embodiments of the present invention are shown by way of illustrative example and are not to be interpreted as limitative of the present invention.

DETAILED DESCRIPTION OF THE PREFERRED EMBODIMENTS

Figure 4:
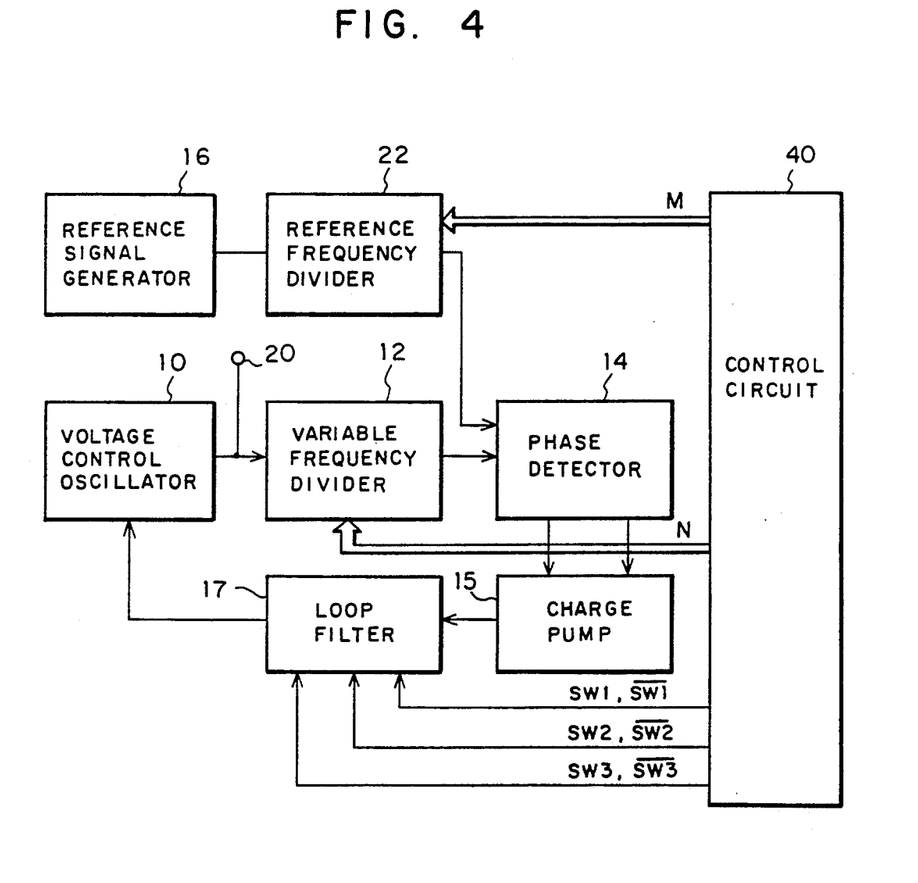
FIG. 4 is a block diagram showing a frequency synthesizer according to one embodiment of the present invention.
Figure 5:
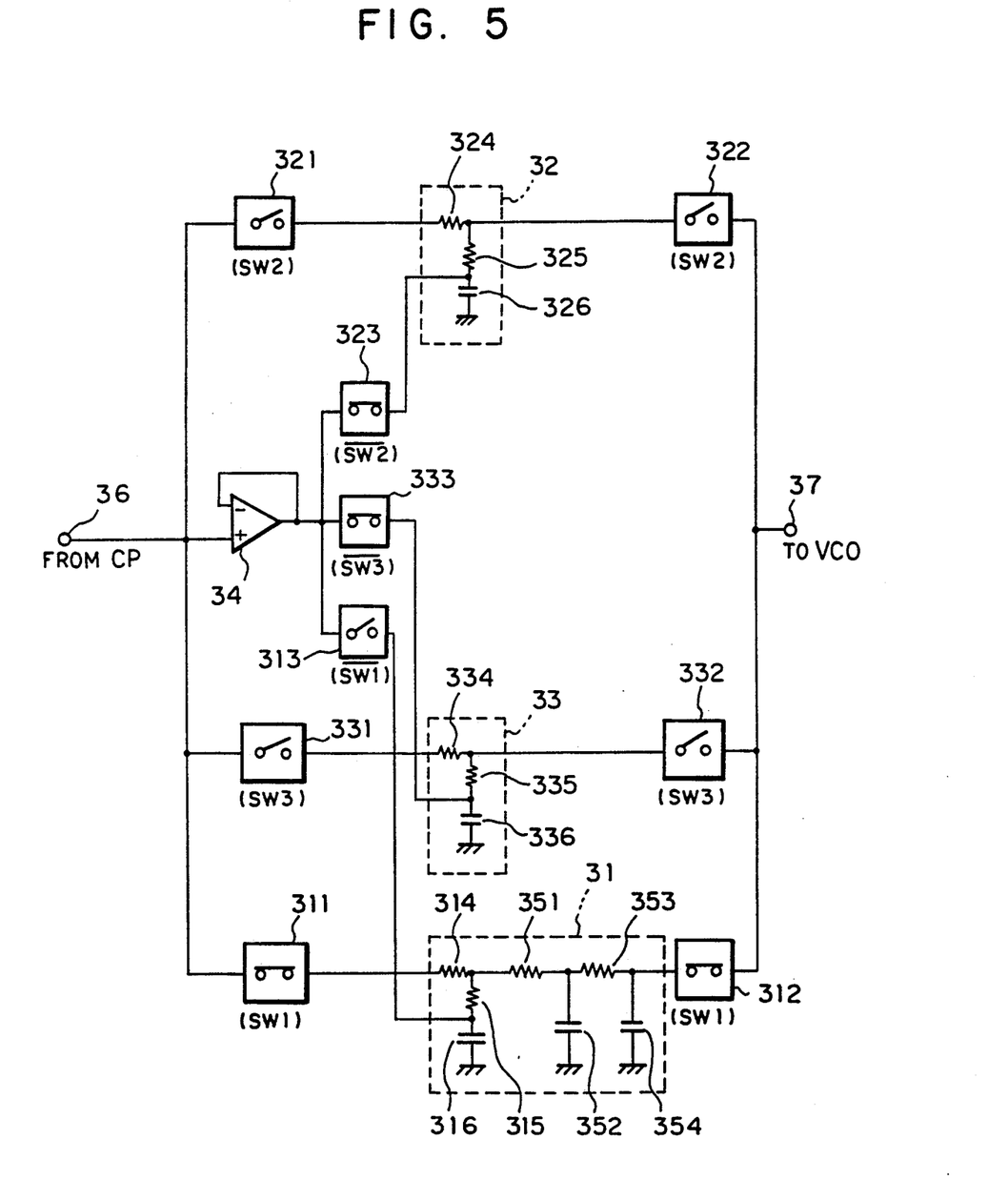
FIG. 5 is a circuit diagram illustrating a loop filter according to a first embodiment of the present invention.

One embodiment of the present invention will hereinafter be described with reference to the accompanying drawings. Referring firstly to FIG. 4, designated at numeral 15 is a charge pump for converting a phase difference signal outputted from a phase detector 14 into an analog voltage quantity. Designated at numeral 22 is an adjustable reference frequency divider for frequency dividing the frequency of the reference signal produced by reference signal generator 16. Numeral 17 indicates a loop filter having a plurality of filter circuits 31, 32, 33 therein as shown in FIG. 5, and numeral 40 indicates a control circuit for inputting a frequency division ratio N to a variable frequency divider 12 and a frequency division ratio M to the reference frequency divider 22, and for applying a changeover or selection signal to each of the switches within the loop filter 17 to be described below. Other parts shown in FIG. 4 which are identical to those depicted in FIG. 1 are denoted by like reference numerals. Incidentally, the analog voltage quantity from the charge pump 15 has logically the same meaning as the phase difference signal from the phase detector 14, and hence the output of the charge pump 15 is referred to as a "phase difference signal".

Figure 4A:
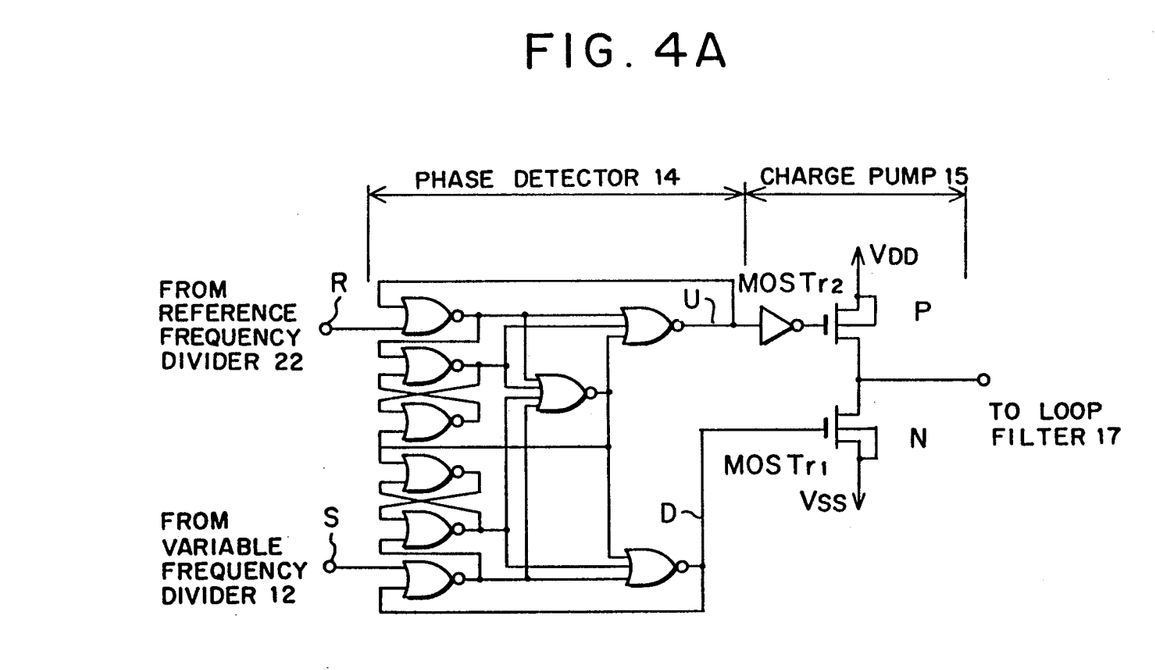
FIG. 4A is a circuit diagram of one example of a phase detector and charge pump as shown in FIG. 4.

FIG. 4A illustrates one example of a possible implementation of phase detector 14 and charge pump 15. The phase detector is made up of a plurality of logically interconnected NOR gates, with the output signal of reference frequency divider 22 being applied to input terminal R and the output signal of variable frequency divider 12 being applied to input terminal S.

A phase difference between the signals applied to terminals R and S is represented by output pulse train signals appearing at output terminals U or D, in which a pulse train at terminal U indicates that the VCO signal lags the reference signal, and a pulse train at terminal D indicates that the VCO signal leads the reference signal, while the width of the pulses is proportional to the degree of phase difference between the VCO and reference signals.

Charge pump 15 includes an inverter coupled to output terminal U, a P-MOS transistor Tr$_2$ connected to the output of the inverter, and an N-MOS transistor Tr$_1$ coupled to output terminal D. The source of transistor Tr$_2$ is connected to a positive voltage V$_{DD}$ and the source of transistor Tr$_1$ is connected to a negative voltage V$_{ss}$. Thus, the charge pump outputs a voltage value that varies in polarity and magnitude according to the phase lead or lag of the reference signal with respect to the VCO signal and the degree or amount of the phase difference.

FIG. 5 is a circuit diagram showing one example of the loop filter 17. In FIG. 5, designated at numerals 31, 32, 33 are separate filter circuits. Numeral 34 indicates a voltage follower (charge/discharge circuit) having a high input impedance. Numerals 311 and 312 indicate changeover or selection switches for connecting and disconnecting the filter circuit 31 from the input terminal 36 and the output terminal 37, and numeral 313 indicates a charging switch provided between the voltage follower 34 and the filter circuit 31, for providing an open/closed state opposite to the open/closed state of the changeover switches 311 and 312. Numerals 314 and 315 are resistors forming a lag-lead type filter. Numeral 316 indicates a capacitor, and numerals 351, 353 respectively indicate resistors which form a low-pass filter used in a steady state. Similarly, numerals 352, 354 designate capacitors. Numerals 321 and 322 indicate selection switches for connecting and disconnecting the filter circuit 32 from the input terminal 36 and the output terminal 37, and numeral 323 indicates a charge/discharge switch provided between the voltage follower 34 and the filter circuit 32 for providing an open/closed state opposite to an open/closed state of the selection switches 321 and 322. Numerals 324 and 325 indicate resistors forming a lag-lead type filter, and numeral 326 indicates a capacitor. Numerals 331 and 332 designate selection switches for connecting and disconnecting the filter circuit 33 from the input terminal 36 and the output terminal 37. Numeral 333 indicates a charge/discharge switch provided between the voltage follower 34 and the filter circuit 33 for providing an open/closed state opposite to an open/closed state of the selection switches 331 and 332. Numerals 334 and 335 indicate resistors forming a lag-lead type filter, and numeral 336 also indicates a capacitor.

Incidentally, the selection switches 311 and 312, 321 and 322, and 331 and 332 will hereinafter be referred to as switches "SW1", "SW2", and "SW3", respectively. In addition, the charge/discharge switches 313, 323, and 333 will be referred to as switches "$\overline{SW1}$", "$\overline{SW2}$" and "$\overline{SW3}$", respectively. Furthermore, the value of the resistor 314 is defined as $R_{314}$, and the capacitance of the capacitor 316 is defined as $C_{316}$. Loop bandwidths of the respective filters 31, 32, 33 are defined as the bandwidth of filter 31 < filter 33 < filter 32.

A description will now be made of the operation of the present embodiment. Consideration will be made with respect to the time required to change frequencies, i.e., a frequency changeover time T. When a change in the frequency division ratio N with respect to the variable frequency divider 12 is made such that a change in frequency of $\Delta f$ occurs in the frequency synthesizer, the frequency changeover time required to allow the output frequency to positively fall within $f \pm \Delta f$ is defined as the sum of frequency synchronizing time $t_s$ necessary for the frequency agreement or adjustment of the loop and the phase synchronizing time $t_p$ required to make the phase of the output signal of variable frequency divider 12 exactly simultaneous with the phase of the reference signal produced after frequency division by the reference frequency divider 22 (based on the technical article entitled "Frequency Synthesizer Theory and Design" published by John Wiley and Sons, Inc., Vol. 5, 1987). In other words, the frequency changeover time T is expressed as follows:

$$T \approx t_s + t_p \tag{4}$$

where $t_s$ and $t_p$ are defined as follows:

$$t_s = \frac{4(\Delta f/N)^2}{B_n^3} \tag{5}$$

$$t_p = \frac{2}{K \cdot \cos \epsilon_{ss}} l_n \left( \frac{2}{Y_e} \right) \tag{6}$$

where $B_n$ represents a noise band of noise inputted to the VCO and is expressed as follows:

$$B_n = \frac{\omega_n}{2} \left( \zeta + \frac{1}{4\zeta} \right) \tag{7}$$

and where $\epsilon_{ss}$ is equal to $\Delta \omega / K$ and $Y_e$ represents a stable phase error.

According to the above expressions (4) through (7), $t_s$ and $t_p$ can be rendered short if the loop gain K and the natural angular frequency $\omega_n$ are appropriately set. Since the sensitivity $K_v$ of the VCO 10 and the sensitivity $K_\phi$ of the phase detector 14 are constant values, the loop gain K can be set to the proper value by setting the frequency division ratio N to an appropriate value. Since the frequency division ratio N is a value inputted to variable frequency divider 12 corresponding to the output frequency produced immediately after the frequency changeover has been made, the gain K is a fixed value after all. On the other hand, when the value of the frequency division ratio inputted to the variable frequency divider 12 is changed stepwise (incrementally) before the ratio is finally set to N, and the natural angular frequency $\omega_n$ is set to an appropriate value according to the values of $\tau_1$ and $\tau_2$ (in other words, when $\tau_1$ and $\tau_2$ are set to proper values), the values of $t_s$ and $t_p$ corresponding to the values of the ratios, which have been set stepwise, are shortened. As a result, it is expected that the frequency changeover time required to achieve a target output frequency will become shorter than that of the conventional synthesizer.

Figure 6:
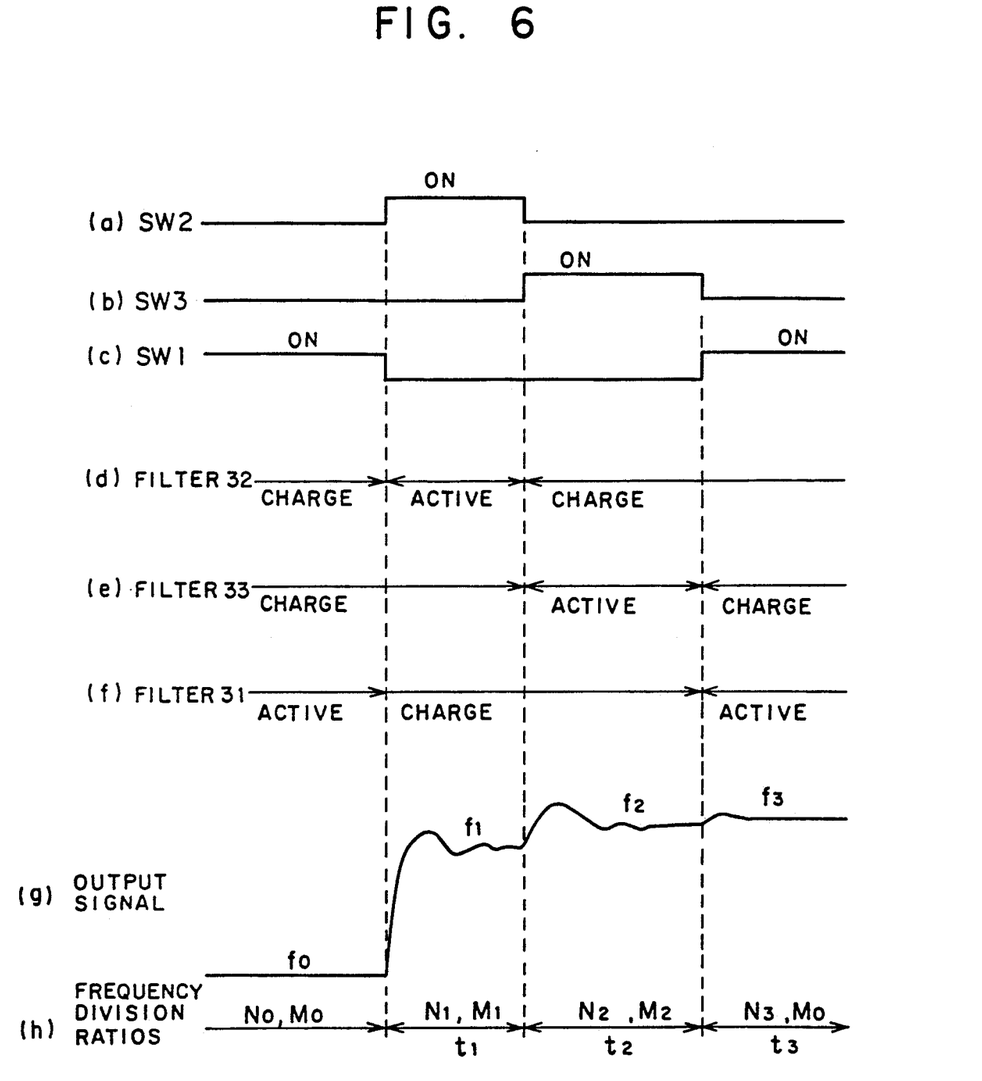
FIG. 6 is a timing chart for describing operations of the loop filter and control circuit of FIG. 5.

More specifically, as shown in FIG. 6 ratios $N_0$ and $M_0$ are initially set in the variable frequency divider 12 and the reference frequency divider 22 in the steady state, respectively. In addition, the filter circuit 31 in the loop filter 17 is employed in the steady state, as shown in FIG. 5. Where a frequency changeover is made under such a steady state, the frequency division ratio set in the variable frequency divider 12 is determined as $N_1$ and the ratio set in the reference frequency divider 22 is determined as $M_1$ at a first step in the frequency changeover process. Similarly, the ratio set in the variable frequency divider 12 and the ratio set in the reference frequency divider 22 are determined as $N_2$, and $M_2$, respectively, at a second step, and the ratio set in the variable frequency divider 12 and the ratio set in the reference frequency divider 22 are determined as $N_3$ and $M_0$, respectively, at a third step. The relationship between $N_1$, $N_2$ and $N_3$, and between $M_1$, $M_2$ and $M_0$ are expressed in the following manner: $N_1 < N_2 < N_3$ and $M_1 < M_2 < M_0$. The values of the resistors 324, 325 and the capacitance of the capacitor 326 in the filter circuit 32 are set so that the values of the damping coefficient $\zeta$ and the natural angular frequency $\omega_n$ become such that the convergence time period $t_1$ required to cause the output frequency $f_1$ determined by the frequency division ratios $N_1$ and $M_1$ to fall into a stable state becomes shorter. In addition, the values of the resistors 334, 335 and the capacitance of the capacitor 336 in the filter circuit 33 are respectively set so that the values of the damping coefficient $\zeta$ and the natural angular frequency $\omega_n$ become such that the convergence time $t_2$ required to cause the output frequency $f_2$ determined by the frequency division ratios $N_2$ and $M_2$ to fall into a stable state becomes shorter. Furthermore, the values of the resistors 314, 315 and the capacitance of the capacitor 316 in the filter circuit 31 are respectively set so that the values of the damping coefficient $\zeta$ and the natural angular frequency $\omega_n$ become such that the convergence time $t_3$ required to cause the output frequency $f_3$ determined by the frequency division ratios $N_3$ and $M_0$ to fall into a stable state becomes shorter. The filter circuit 31 has also a low-pass filter (which is comprised of resistors 351, 353 and capacitors 352, 345) for eliminating spurious components of the phase difference signal or the like in a steady state.

A description will now be made of the operation of the frequency synthesizer to be carried out upon changeover of the frequency. The operations of the VCO 10, the variable frequency divider 12, the phase detector 14 and the reference signal generator 16 are the same as those executed in the conventional synthesizer. However, in the present embodiment, frequency division ratios are set to the variable frequency divider 12 stepwise in a single frequency changeover process, as described above. The frequency division ratio $N_0$ is first set in the variable frequency divider 12, whereas the frequency division ratio $M_0$ is first set in the reference frequency divider 22, and the frequency synthesizer is kept under a steady state at an output frequency $f_0$. Under this condition, the switch SW1 is kept in an ON (closed) state and the switches SW2, SW3 are kept in an OFF (open) state in the loop filter 17, in accordance with command signals produced by the control circuit 40 (this corresponds to the state shown in FIG. 5). Thus, the phase difference signal passes through the filter circuit 31. The capacitors 326, 336 in the filter circuits 32, 33 have been charged by the voltage follower 34 at the level of the output voltage of the filter circuit 31 from charge pump 15, i.e., at the level of a value equal to the control voltage supplied to the VCO 10 in the steady state.

When a command for a frequency changeover is given, the control circuit 40 sets the frequency division ratio to be inputted to the variable frequency divider 12 to $N_1$ and the frequency division ratio to be applied to the reference frequency divider 22 to $M_1$. At the same time, the control circuit 40 also turns on the switch SW2 and turns off the switch SW1. The switch SW3 still remains in an OFF state (see FIG. 6). Incidentally, the switch $\overline{SW2}$ is switched to an OFF state whereas the switch $\overline{SW1}$ is switched on. In this state, the phase difference signal passes through the filter circuit 32. As described above, the resistance value $R_{324}$ and the capacitance $C_{326}$ are set in the filter circuit 32 such that $\tau_1 = C_{326} \times R_{324}$ and $\tau_2 = C_{326} \times R_{325}$ become optimal values with respect to the frequency division ratios $N_1$ and $M_1$. Thus, the output frequency converges to $f_1$ in the shorter convergence time period $t_1$. During this period, the capacitors employed in the filter circuits 31, 33 are charged or discharged by the voltage follower 34 according to the detected phase difference and follow variations in the control voltage of the VCO 10.

After $t_1$ has elapsed, the control circuit 40 sets the frequency division ratios in the variable frequency divider and the reference frequency divider to $N_2$ and $M_2$, respectively. The time at which the frequency division ratio is to be changed over by the control circuit 40, i.e., the elapsed time $t_1$, can be calculated or determined based on various constants employed in the filter circuit 32, and is set in advance in the control circuit 40. At the same time, the control circuit 40 turns on the switch SW3 and turns off the switch SW2. The switch SW1 still remains in an OFF state. Incidentally, the switch $\overline{SW3}$ is switched off, and the switch $\overline{SW2}$ is switched on (see FIG. 6). Thus, the phase difference signal passes through the filter circuit 33 in this state. As described above, the resistance values and the capacitance values are set in the filter circuit 33 such that $\tau_1 = C_{336} \times R_{334}$ and $\tau_2 = C_{336} \times R_{335}$ become optimal values with respect to the frequency division ratios $N_2$, $M_2$. At the time that the frequency division ratios have been changed to $N_2$ and $M_2$, the capacitor 336 has already been charged to a voltage level closer to the control voltage at the time that the output frequency is rendered stable at $f_2$. Accordingly, the output frequency converges to $f_2$ in the shorter convergence time period $t_2$. During this period, the capacitors 316, 326 employed in the filter circuit 31, 32 follow changes in the control voltage of the VCO 10 under the control of the voltage follower 34.

After $t_2$ has elapsed, the control circuit 40 then sets the frequency division ratios to $N_3$ and $M_0$. At the same time, the control circuit 40 turns on the switch SW1 and turns off the switch SW3. The switch SW2 still continues to be an OFF state. Incidentally, the switch $\overline{SW3}$ is brought into an ON state, and the switch $\overline{SW1}$ is brought into an OFF state (see FIG. 6), i.e., this means the return to the state shown in FIG. 5. The phase difference signal passes through the filter circuit 31 in this state. As described above, the resistance and the capacitance values are set in the filter circuit 31 such that $\tau_1 = C_{316} \times R_{314}$ and $\tau_2 = C_{316} \times R_{315}$ become optimal values with respect to the frequency division ratios $N_3$ and $M_0$. However, since the filter circuit 31 is used in the steady state, the resistance values and the capacitance values are established such that noise components of the phase difference signal can be eliminated, taking into consideration such a point as referred to above. On the other hand, when the frequency division ratios are changed to $N_3$ and $M_0$, the capacitor 316 has already been charged to a voltage level closer to the control voltage at the time that the output frequency is rendered stable at $f_3$. Thus, the output frequency converges to $f_3$ in the shorter convergence time period $t_3$. The low-pass filter contained in the filter circuit 31 eliminates spurious components of the phase difference signal in the steady state, after which the output frequency has converged to $f_3$, whereby a satisfactory steady state can be realized.

The frequency changeover time, i.e., the time interval from the state in which the output frequency has converged to $f_0$ to the state in which the output frequency has converged to $f_3$ finally becomes $t_1 + t_2 + t_3$. This value can be significantly shortened as compared with the case where the frequency division ratio is changed directly to $N_3$ from $N_0$.

Figure 7:
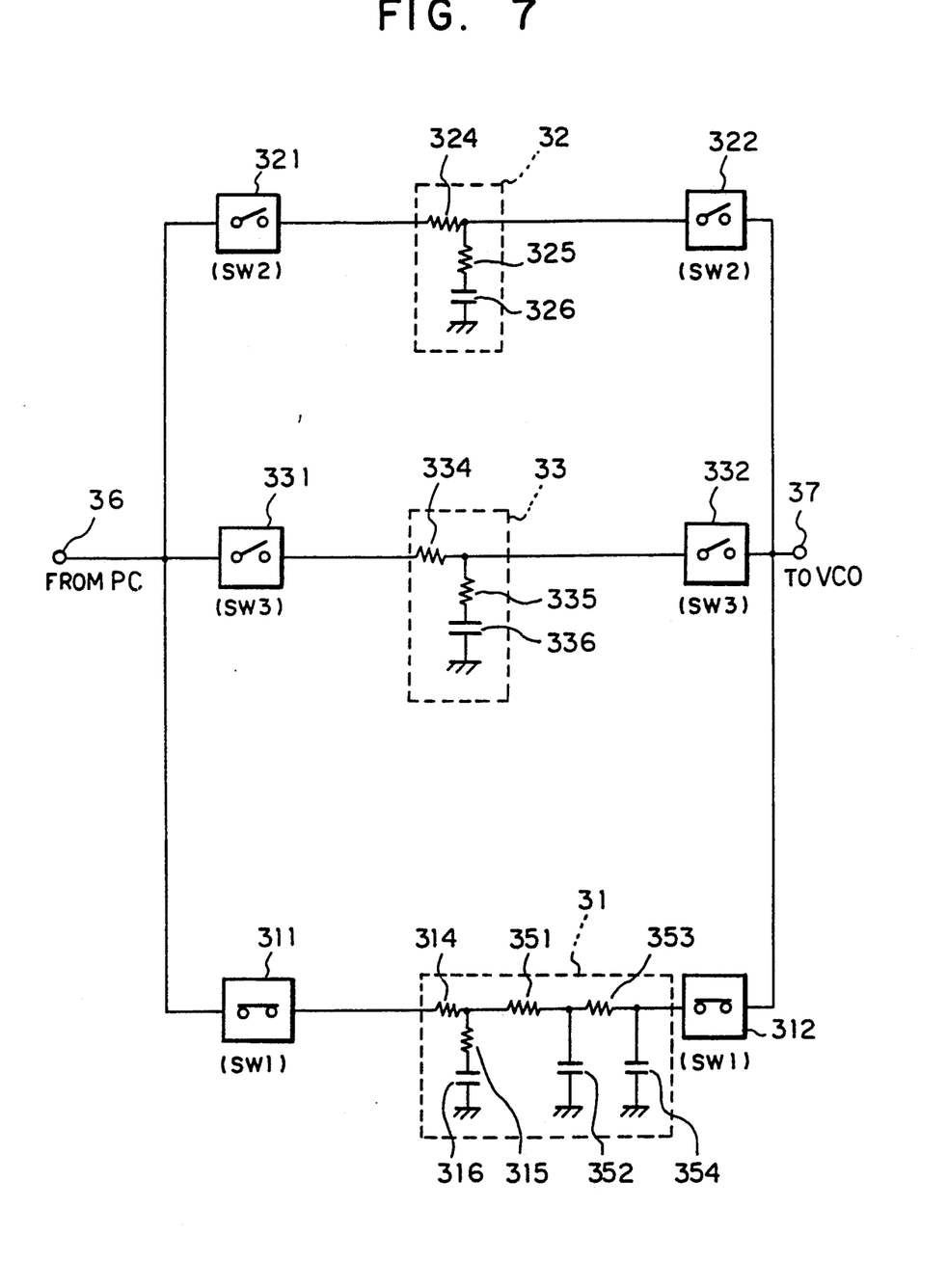
FIG. 7 is a circuit diagram depicting a loop filter according to a second embodiment of the present invention.

FIG. 7 is a circuit diagram showing a loop filter employed in a frequency synthesizer according to a second embodiment of the present invention. The circuit diagram shown in FIG. 7 differs from FIG. 5 in that the respective switches $\overline{SW1}$, $\overline{SW2}$, $\overline{SW3}$ used for charging the capacitors 316, 326, 336 and the voltage follower 34 are omitted. Thus, in the frequency changeover process, the capacitors 316, 326, 336 are not charged in advance for purposes of the following step, and $\tau_1$ and $\tau_2$ are set to optimal values in the respective filters 31, 32, 33. This will be useful in exhibiting an effect that each convergence time period of $t_1$, $t_2$ and $t_3$ is shortened, although not as short as for the embodiment of FIG. 5. Incidentally, each timing point at which each of the switches SW1, SW2 and SW3 is changed over by the control circuit 40 is the same as that shown in FIG. 6, and its description will therefore be omitted.

Figure 8:
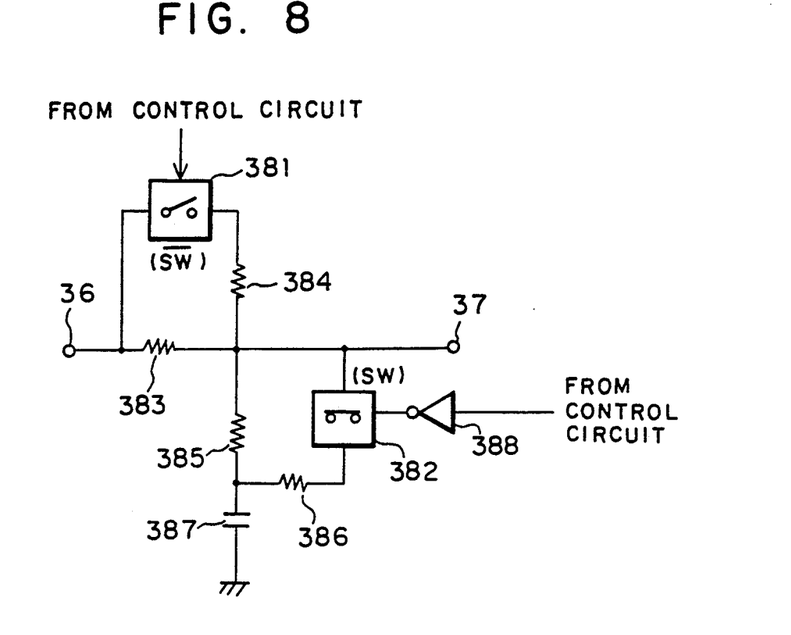
FIG. 8 is a circuit diagram showing a loop filter according to a third embodiment of the present invention.
Figure 9:
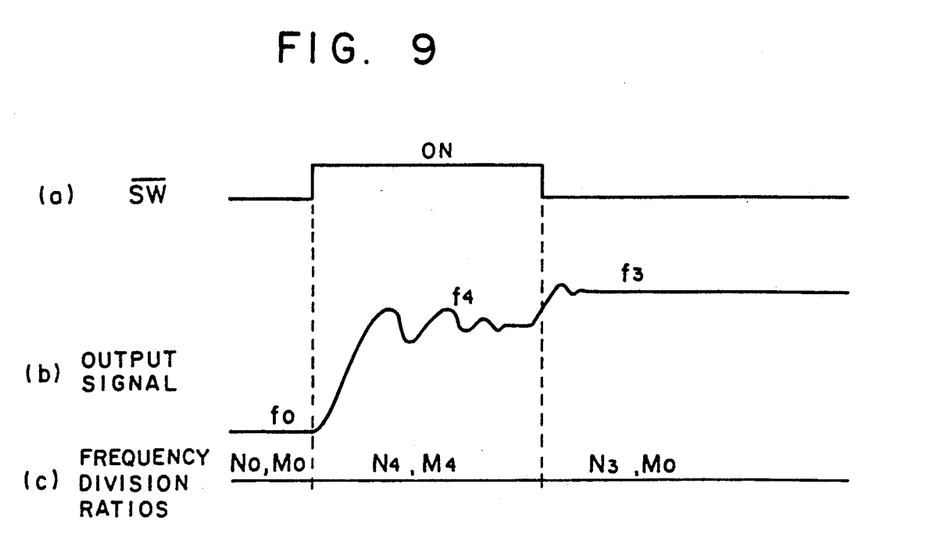
FIG. 9 is a timing chart for describing operations of the loop filter and control circuit of FIG. 8.

In order to realize a simpler structure, the loop filter may be constructed as shown in FIG. 8. In other words, a switch 381 (hereinafter called "a switch $\overline{SW}$") is kept in an OFF state, whereas a switch 382 (hereinafter called "a switch $\overline{SW}$") is kept in an ON state. The frequency division ratios set in the variable frequency divider 12 and the reference frequency divider 22 by the control circuit 40 before the frequency changeover occurs are respectively $N_0$ and $M_0$ corresponding to the output frequency $f_0$ (see FIG. 6). When a demand for frequency changeover is made, the control circuit 40 first sets the frequency division ratios of both dividers to $N_4$ and $M_4$, respectively, and also turns on the switch $\overline{SW}$ and turns off the switch SW (see FIG. 9). Incidentally, since an inverter 388 is provided in the circuit depicted in FIG. 8, a single switch changeover signal output from the control circuit 40 may be used. After a predetermined period of time has elapsed, the control circuit 40 sets the frequency division ratios to $N_3$ and $M_0$ respectively, and at the same time, turns off the switch $\overline{SW}$ and turns on the switch SW (see FIG. 9). Accordingly, in the same manner as the first embodiment, if the resistance values of resistors 383, 384, 385, 386 and the capacitance of a capacitor 387 are set such that $\tau_1 = C_{387} \times (R_{384} \| R_{383})$ and $\tau_2 = C_{387} \times R_{385}$ become optimal values according to the frequency division ratios $N_4$, $M_4$ and $\tau_1 = C_{387} \times R_{383}$ and $\tau_2 = C_{387} \times (R_{385} \| R_{386})$ become optimal values according to the frequency division ratios $N_3$, $M_0$, the frequency changeover time is shortened as compared with that in the prior art, although not as much as that in the first embodiment.

Figure 10:
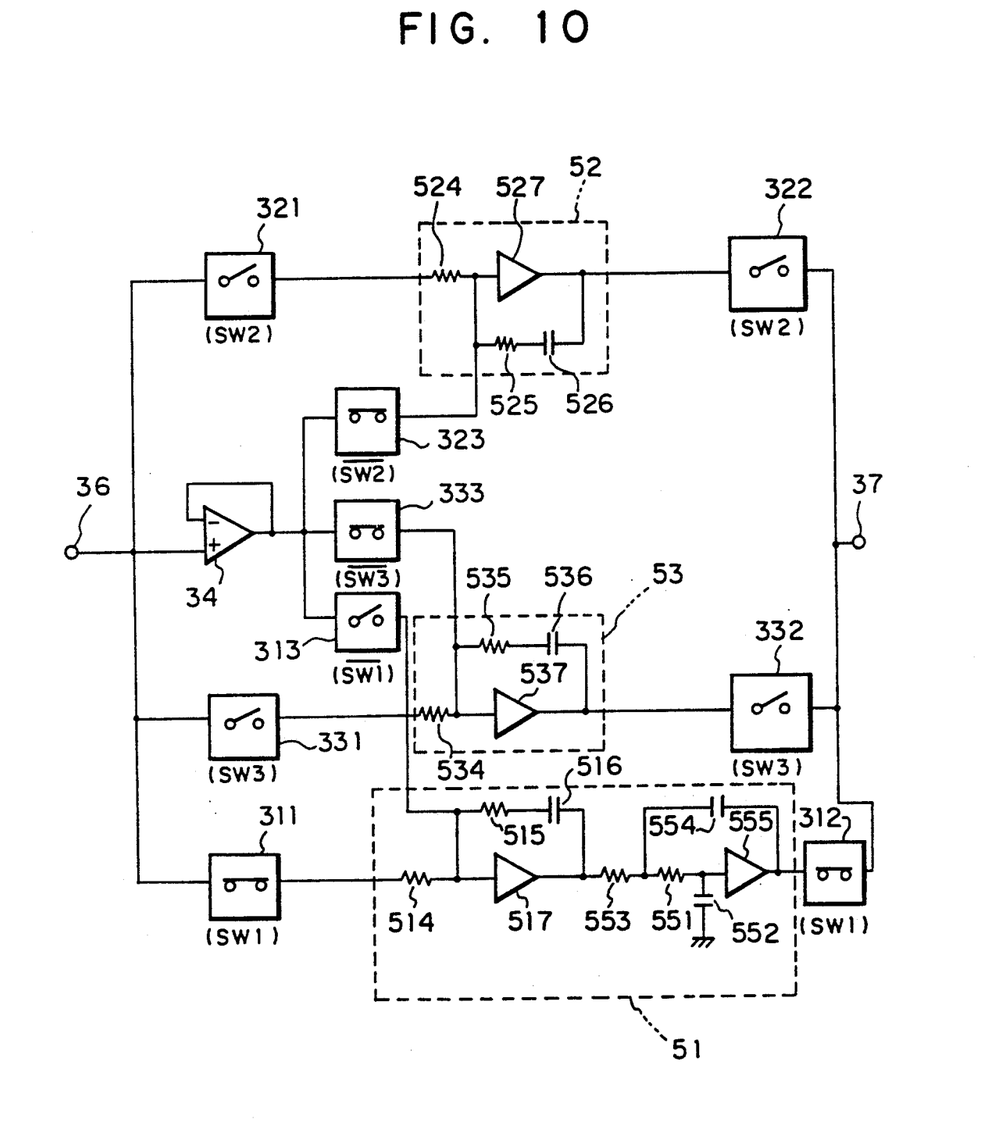
FIG. 10 is a circuit diagram depicting a loop filter according to a fourth embodiment of the present invention.

FIG. 10 is a block diagram showing a fourth embodiment of the present invention in which filter circuits 51, 52, 53 forming the loop filter are constructed by means of operational amplifiers 517, 527, 537. In the circuit structure shown in FIG. 10, $\tau_1$ and $\tau_2$ in a steady state are defined by $\tau_1 = C_{516} \times R_{514}$ and $\tau_2 = C_{516} \times R_{515}$ respectively. In the first step, $\tau_1$ is equal to $C_{526} \times R_{524}$ and $\tau_2$ is equal to $C_{526} \times R_{525}$, whereas $\tau_1$ is equal to $C_{536} \times R_{534}$ and $\tau_2$ is equal to $C_{536} \times R_{535}$ in the second step. Merely the theoretical expressions in a case where one attempts to fix optimal $\tau_1$ and $\tau_2$ are different from each other, and hence the circuit shown in FIG. 10 operates in the same manner as the first embodiment shown in FIGS. 5 and 6, and hence exhibits an effect similar to that of the first embodiment. In FIG. 10, resistors 551, 553, capacitors 552, 554 and operational amplifier 555 constitute a low-pass filter.

Incidentally, the voltage follower 34 and respective switches $\overline{SW1}$, $\overline{SW2}$, $\overline{SW3}$ may be omitted from the circuit structure shown in FIG. 10. In this case, this structure exhibits the same effect as that brought about by the frequency synthesizer employing the loop filter (shown in FIG. 7) according to the second embodiment, which comprises the respective filters 31, 32, 33 formed of passive elements.

Figure 11:
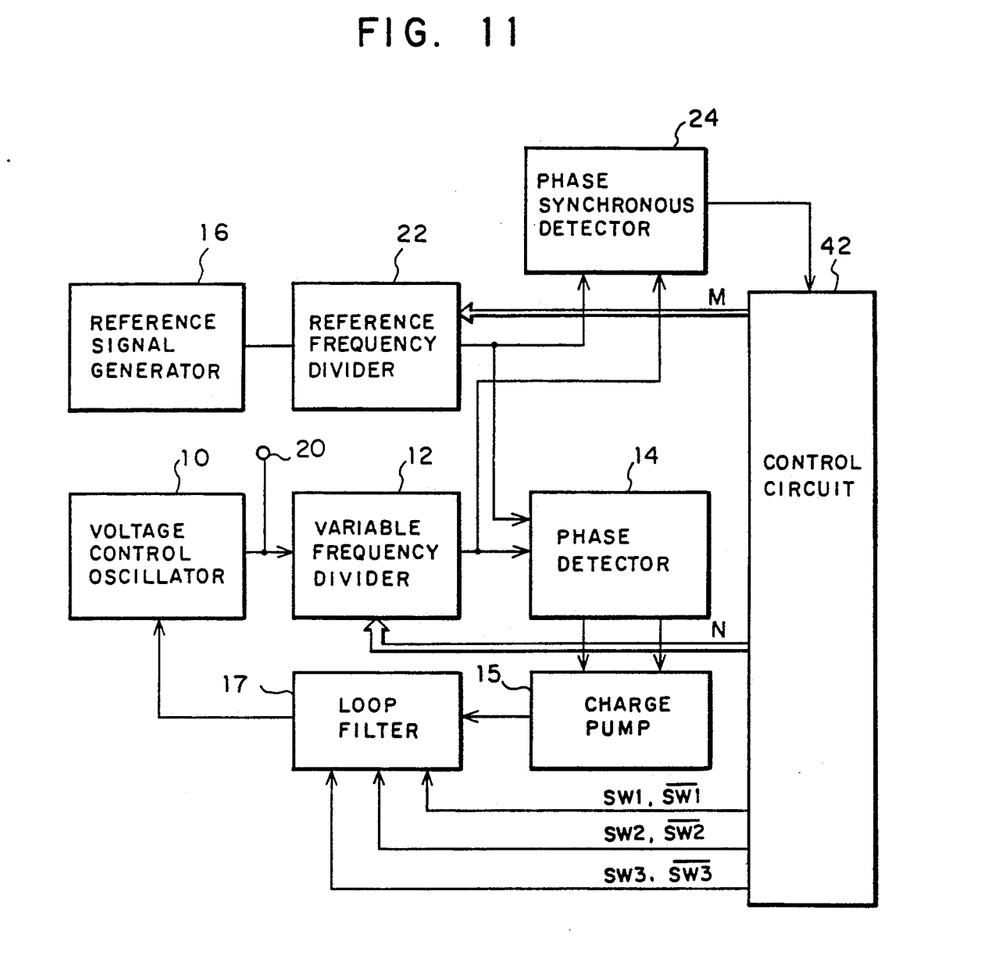
FIG. 11 is a block diagram showing a frequency synthesizer according to a fifth embodiment of the present invention.

In the illustrated embodiments, although time periods $\tau_1$ and $\tau_2$ have been defined as predetermined values, a phase synchronous detecting circuit 24 may be provided as shown in FIG. 11. In this case, when synchronization of the phases of outputs from frequency dividers 12 and 22 is established in each of the frequency-changeover processes, the phase synchronous detecting circuit 24 sends information about the synchronized state to a control circuit 42. Then, the control circuit 42 immediately produces a changeover signal for the switches SW1, SW2 and SW3 to change the present process to the following process. In doing so, the time necessary for each process can be even further shortened.

The frequency division ratio has been set to a constant $M_0$ in each of the embodiments described above. However, this is not necessarily limited to the constant $M_0$.

As has been described above, the present invention provides a frequency synthesizer of a type wherein a loop filter is comprised of a plurality of filter circuits and the time constant of each filter circuit is determined according to the frequency division ratio with which each filter circuit is used, and wherein the frequency division ratio corresponding to each filter circuit is set in each step of the frequency changeover process and a control circuit for selecting one of the filter circuits corresponding to the frequency division ratio thus set is provided. Therefore, the frequency changeover time interval from the time of a request for a frequency changeover to the time at which an output frequency is brought into a stable state can be shortened, thereby bringing about an effect that the frequency synthesizer can be operated at a high speed.

According to the present invention, since the frequency synthesizer is further constructed such that the voltage of each capacitor employed in each filter circuit follows a control voltage in each step of the frequency changeover process, there is provided an effect that the frequency synthesizer which makes the frequency changeover time even shorter still can be achieved.

Having now fully described the invention, it will be apparent to those skilled in the art that many changes and modifications can be made thereto without departing from the spirit or scope of the invention as set forth herein.

What is claimed is:

1. A frequency synthesizer, comprising:
   a voltage controlled oscillator (VCO) for generating an output signal having a frequency corresponding to a control voltage signal; and
   means for switching said control voltage signal from a first value corresponding to a first output frequency to a second value corresponding to a second desired frequency, including
      means for changing said control voltage signal from said first value to at least one intermediate value corresponding to an intermediate frequency between said first output frequency and said second desired frequency,
      filter means for outputting said control voltage signal to said VCO and having a plurality of selectable frequency characteristics, and
      control means for providing command signals to said means for changing and to said filter to select frequency characteristics of said filter corresponding to said intermediate frequency when said at least one value is selected by said means for changing.

2. A frequency synthesizer according to claim 1, wherein said means for changing comprises:
   a variable frequency divider for dividing the frequency of said output signal of said VCO by a frequency division ratio corresponding to a command signal from said control means;
   a reference frequency divider for dividing a frequency of a reference signal by a frequency division ratio corresponding to a command signal from said control means;

a phase detector for detecting a phase difference between the frequency-divided signals of said variable frequency divider and said reference frequency divider and outputting a phase difference signal corresponding to the detected phase difference; and a charge pump for converting said phase difference signal into an analog voltage quantity as a control voltage signal which is applied to said filter means.

3. A frequency synthesizer according to claim 2, wherein said filter means comprises:

a plurality of filter circuits each having a time constant corresponding to particular frequency division ratios; and switching means for connecting and disconnecting each of said plurality of filter circuits to said VCO and said charge pump in accordance with command signals from said control means.

4. A frequency synthesizer according to claim 3, wherein said means for changing changes said control voltage signal from said first value to a first intermediate value corresponding to a first intermediate frequency, from said first intermediate value to a second intermediate value corresponding to a second intermediate frequency, and from said second intermediate value to said second value corresponding to said second desired frequency, and said plurality of filter circuits comprises a first filter circuit having a time constant corresponding to said first intermediate value, a second filter circuit having a time constant corresponding to said second intermediate value, and a third filter circuit having a time constant corresponding to said first value and said second value.

5. A frequency synthesizer according to claim 4, wherein said third filter circuit is connected to said VCO and said charge pump in a steady state mode of operation, and includes a low pass filter.

6. A frequency synthesizer according to claim 5, wherein said filter means further comprises:

charge/discharge means for charging and discharging capacitors of filter circuits disconnected from said VCO and said charge pump to a voltage equal to said control voltage signal outputted by a filter circuit connected to said VCO and said charge pump.

7. A frequency synthesizer according to claim 6, wherein said charge/discharge means comprises a voltage follower for receiving a voltage from said charge pump, and a plurality of switches for selectively connecting an output of said voltage follower to each of said capacitors of said filter circuits.

8. A frequency synthesizer according to claim 7, wherein said control means stores information regarding the time required for said control voltage to enter a steady state for each of said filter circuits, and updates said command signals upon the expiration of said time.

9. A frequency synthesizer according to claim 2, further comprising a phase synchronous detector for detecting a coincidence in phase between said variable frequency divider and said reference frequency divider and outputting a phase coincidence signal to said control means to cause said control means to update said command signals.

10. A frequency synthesizer according to claim 6, further comprising a phase synchronous detector for detecting a coincidence in phase between said variable frequency divider and said reference frequency divider and outputting a phase coincidence signal to said control means to cause said control means to update said command signals.

* * * * *

UNITED STATES PATENT AND TRADEMARK OFFICE
CERTIFICATE OF CORRECTION

PATENT NO. : 5,107,220

DATED : April 21, 1992

INVENTOR(S) : Akira Andoh

It is certified that error appears in the above-identified patent and that said Letters Patent is hereby corrected as shown below:

Column 5, line 67, "$Y_e$" should be --$\Upsilon_e$--.

Column 6, line 8, "$Y_e$" should be --$\Upsilon_e$--.

Column 9, line 7, "$\overline{SW}$" should be --$SW$--.

Signed and Sealed this

Nineteenth Day of October, 1993

BRUCE LEHMAN

*Attest:*

*Attesting Officer*     *Commissioner of Patents and Trademarks*